United States Patent [19]

Burbey

[11] Patent Number: 4,764,795
[45] Date of Patent: Aug. 16, 1988

[54] PREPRESS GRAPHIC REGISTRATION SYSTEM

[76] Inventor: Mark J. Burbey, 10945 E. Evening Creek Dr., San Diego, Calif. 92128

[21] Appl. No.: 42,847

[22] Filed: Apr. 27, 1987

[51] Int. Cl.$^4$ .............................................. G03B 27/28
[52] U.S. Cl. ...................................... 355/125; 101/12; 355/132
[58] Field of Search .................... 101/12; 355/77, 125, 355/132, 133

[56] References Cited

U.S. PATENT DOCUMENTS

| | | | |
|---|---|---|---|
| 1,151,461 | 8/1915 | Hatt | 101/DIG. 12 |
| 2,470,437 | 7/1946 | Hoerth | 101/DIG. 12 |
| 2,492,528 | 9/1944 | Huebner | 101/DIG. 12 |
| 2,613,744 | 10/1949 | Hillmer | 101/DIG. 12 |
| 2,650,405 | 6/1954 | Faeber | 101/DIG. 12 |
| 2,866,397 | 12/1958 | Gillette | 355/125 X |
| 3,160,096 | 12/1964 | Norton | 101/DIG. 12 |
| 3,202,071 | 8/1965 | Carlson | 355/125 |
| 3,288,063 | 11/1966 | Bungay | 101/DIG. 12 |
| 3,605,622 | 7/1969 | Zarip | 101/DIG. 12 |
| 3,771,440 | 11/1973 | Eburn | 101/DIG. 12 |
| 4,159,176 | 6/1979 | de Masi | 355/125 X |
| 4,533,240 | 8/1985 | Jasperson | 355/125 |

*Primary Examiner*—Richard A. Wintercorn
*Attorney, Agent, or Firm*—Robert von Heck

[57] ABSTRACT

The invention sets forth an exceedingly accurate, however simple system or process for preparation of an Offset Printing-plate for consistant aligned matrices, while eliminating costly time consuming procedures and expensive apparatus of alignment; whereby: (a) the 2-dimensional graphic-art article is affixed to a standard Photo-table adjacent to a simple reference-line, as a preliminary registration-reference means; (b) the resulting repro-film is then provided with a special 'anti-stretch'/backing-strip at one end (if it is of the inexpensive paper type place), and then placed upon a special zero-registration platen equipped with a special 'floating Sight-wire' is to be visually aligned in superimposition over the said Ref.-line which was photographed with the said graphic-artwork, and a plurality of standard press/indexer-holes are simultaneously punched into the said backing-striped end area, thereby at once establishing the critical prepress-registration; (c) which is then transferred directly to the standard plurality of Offset-press Indexer-pins, for subsequent printing procedures. Hence, a cost-effective system, enabling paper-resin type plates to substantially equal the more costly metal-plates in reproductive quality for at least 10,000-runs, plus the virtural eliminaton of 'plate-skew & creep' enables printers to attain exceptionally tight-registration demands of 2 & 3-color runs without inordinate attention to alignment, since hairline accuracy is locked-in by this process; plus, handy expedient format layout/worksheet are provided, which further enhance the ability of a relative novice-printer operator to achieve reproduction results appearing entirely professional.

11 Claims, 1 Drawing Sheet

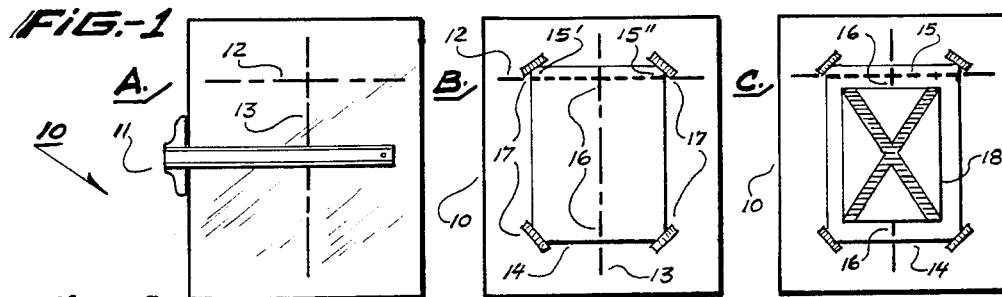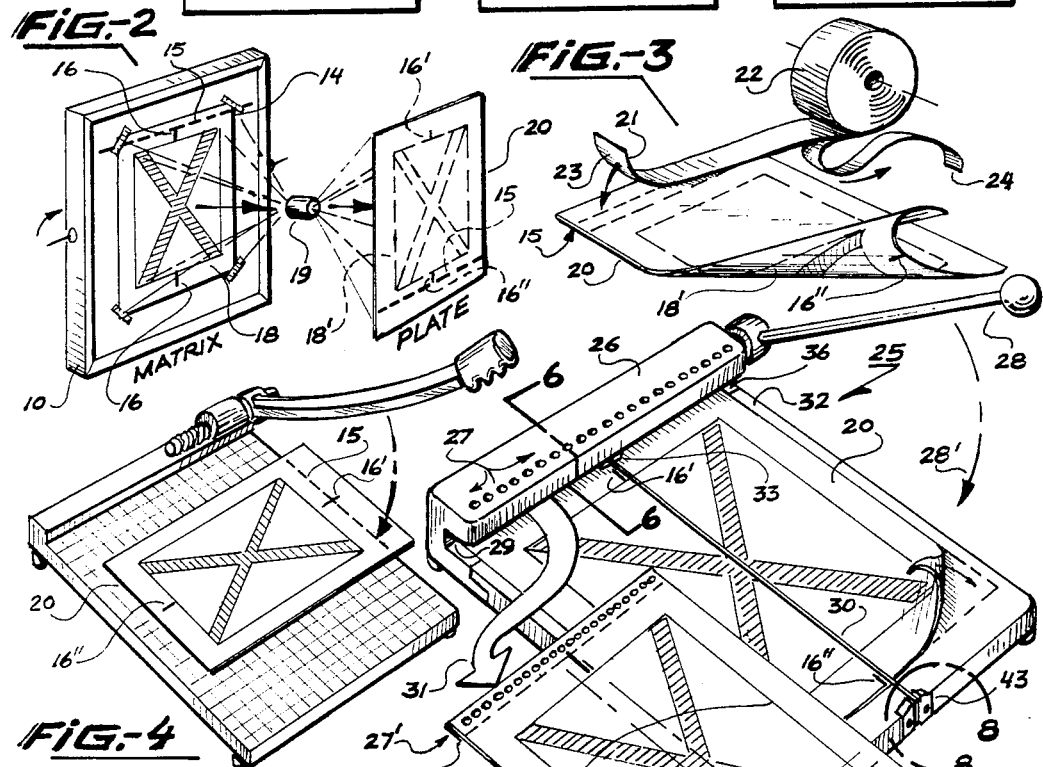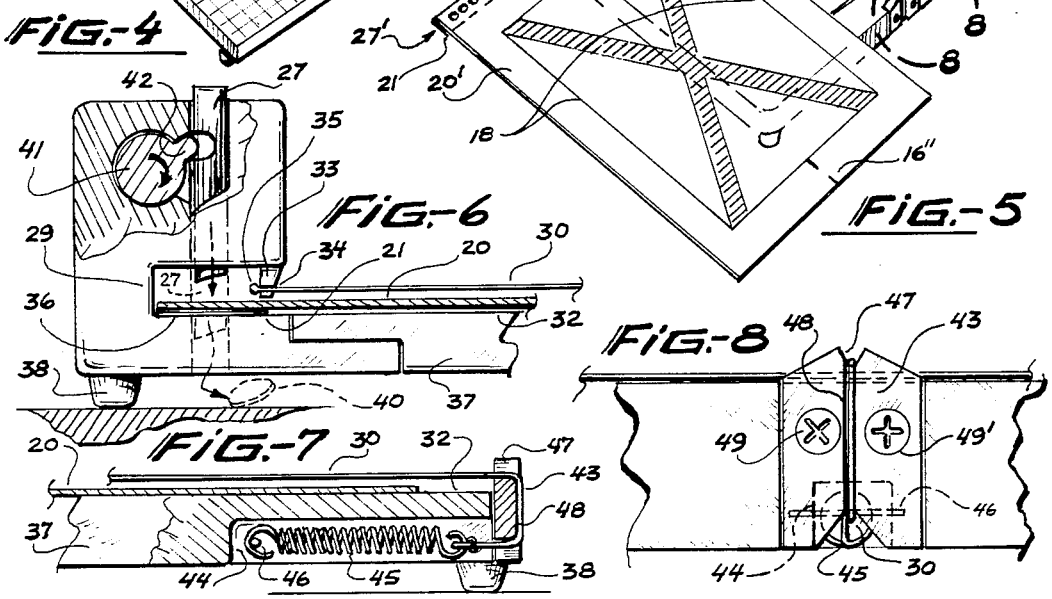

PREPRESS GRAPHIC REGISTRATION SYSTEM

BACKGROUND OF THE INVENTION

The subject invention primarily relates to a special system or method for prepress-preparation of photographic Offset/printing-plates, the essential requirement being to facilitate quick & easy precision artwork image-registration, for critical printing of general Offset-printing but particularly for the more demanding tight adherence to an initial alignment installation upon the press; plus accurate alignment and maintance of a given alignment for multi-color applications within single-run setups for example, as well as for maintance of exact alignment one-plate to another-plate. Examples of this area of invention endeavor in the past is represented by U.S. Pat. Nos. 3,771,440, 3,605,622, 3,288,063, 3,160,096, 2,680,405, 2,613,744, and 1,151,461 (year 1915), none of which distinguish themselves in anticipating the relatively direct and low-cost methodology by which my invention hereof demarcates itself, as is to be explained.

CONCEPTION OF THIS INVENTION

Heretofore, when a flexible Offset/Printing-plate was prepared for Press-duplications, especially in the smaller quick-turnaround budget-job shops, the various novel attempts to secure vital press alignment (particularly employing the paper-resin type plates) over a run from 100 through 1,000, and 10,000-impressions or more was considered impossible. However, necessity being the fostering of invention, in order to make my highly competative hi-volume/small-job Printing-business a success, I discovered some proprietary steps leading to the development of the 'PENTARCH (five-step) Registration-system' as is to be defined.

Accordingly, this invention is a system of procedure employing a minimum of special apparatus, characterized by the following objectives:
- to provide inexpensive paper-resin Printing-plates with a minor modification enabling them to virtually compete in quality results with costly metal-plates;
- to virtually eliminate the need for expensive photo-negatives;
- to permanently 'lock-in' a given registration, without any modification of existing Printing-press equipment;
- to eliminate printing waste caused by imperfect reproductions;
- to substantially shorten press-time by eliminating defects;
- to substantially reduce pre-press/setup attention to precision, actually enabling the novice apprentice-printer to achieve professional reproductions, even in multi-colors.

Thus, while various past patent endeavors have achieved some degree of improvement sought by their inventor, none of these had perfected a system entirely useful by the small modern printshop in particular, since they cannot usually afford the financial outlay for elaborate sophisticated equipment much beyond the standard outfittings of the trade. In contrast, my system only entails a few simple provisions that most any modest printshop can afford.

SUMMARY OF THE INVENTION

Therefore, in compliance with the afore said and further objects of invention, it is intended to provide some specialized pre-printed 'artwork paste-up sheets' which are individually copyrighted in format for use with this invention, so are replete with a special indicia-matrix of grid like background, particularly adaptable to specific jobs, such as imprinting of business-stationery, business-cards, small brochures & flyers, etc.

A further object of this invention is to provide a procedural sequence of five simple steps to attain pre-press-setup, tantamount to a 'system' per'se, which is exceptionally quick & easy to expedite, as will be elaborated upon in detail within the subsequent specification section of this document.

Another object of this invention is to setforth a special means of Plate/Mounting-reinforcement, whereby a thin-guage of aluminum-tape or Mylar-tape is simply applied to the upper-back of any conventional paper or plastic sheet type of cheaper Offset/Printing-plate prior to punching of the plurality of Press Mounting-holes, so as to thereby substantially extend the usable life of the relatively inexpensive Plates to that about comparable with that of the much more costly aluminum-sheet type of Plate requiring careful preparation of a separate photo-negative film. Without the provision of my special 'Plate-mounting Reinforcement-strip', the paper-resin/plastic Plates would always be plagued with 'plate-skew' & 'creep' attributable to elongation of the approximately two-dozen Plate/Index Mounting-holes of about 3/16ths-inch diameter which engage over a like number of Press-drum/Mounting-pins of about ⅛th diameter; the said hole-elongation being brought about by the effect of the drag-friction necessarily imposed by the pressure of the rotational-loading introduced by the normal offset printing process, whereby the elongation-creep thus results and the differential of roller-tension being applied by the operators adjustments will induce the likewise dreaded elongation-skew to one side or the other; but my special 'anti-elongation' Reinforced-backing provision eliminates this pesky problem.

Another object of this invention is to setforth a special method of attaching the essential 'floating reference-line' device provided for in conjunction with the special Plate Mounting-hole Simultaneous-punching Platen apparatus which so contributes to the efficiency of this system. The said FRL/Floating Ref.-line is a preferably dayglo-orange (for high visual-aquity) mono-filiment/plastic-line maintained in a taught degree of precise alignment condition via a small tension-spring at the base-end of the said hole-punching Platen, while at the header-end having the plurality of two-dozen or so punch-pins operated simultaneously via a cam-action co-axial transverse-shaft to which a manual hand-lever is connected at the right-side. The Header-bar containing the punch-pins includes a special 'drop-center flange' having a tiny hole therein so as to place the said Ref.-line just slightly above the deck of the platen in a manner aligning the Ref.-line exactly on longitudinal-center with the center header/punch-pin, and absolutely resistant to any possible displacement from this exactitude even if the flexible Ref.-line were accidently knocked to one-side temporarily. The said tiny-hole provided for the Ref.-line is of sufficient aperature as to prevent the knoted end of the line to be concealed beneath the said header-bar assembly, and so no complex attachment device is present to obscure the vision of the Punch-operator who must visually look down upon the upper region of the yet un-punched Plate as he (she) acts to align the top & bottom 'tic-narks' used for alignment orientation. Since the said Ref.-line extends down the longitudinal center of the Platen-deck, and is preferably located into a slightly raised vee-notch at the lower extrimity of the Platen, the visual-paralax effect of aligning the Ref.-line exactly above the Ref.-tic's indica previously photographed upon the yet unpunched Plate is essentially obviated.

Accordingly, while this invention will be further described in conjunction with certain preferred embodiments, it is intended that the invention not be limited to such specific configurations; on the contrary, it is intended to cover all alternatives, modifications, and equivalents which may be found within the spirit & scope of this invention, as is still further defined in the specifications.

BRIEF DESCRIPTION OF THE ACCOMPANYING DRAWING

The proceeding summary, as well as further objects, features, and advantages of the subject invention, will be more fully appreciated and clarified by reference to the following detailed drawings of the preferred embodiment, which is shown in accordance with the present Claims; wherein:

FIG. 1, is a three-sequence top/plan-view of a conventional camera phototable whereon is shown the initial stage of the invention system.

FIG. 2, is a left-oblique pictorial-view showing the camera matrix at left as was seen in FIG. 1 but here rotated to a vertical attitude relative to an exemplified camera-lens at center, and a likewise vertical printing-plate at the right which is demonstrating transfer of the photo-image from the said matrix.

FIG. 3, is a left-oblique pictorial-view of the imaged printing-plate, whereon is principally shown the back side of the plate being specially treated.

FIG. 4, is a left-oblique pictorial-view of a conventional cutting-table apparatus, whereon is shown the specially imaged plate oriented to the desired cutting position, whereby movement of the cutting-arm is suggested via ref.-arrow.

FIG. 5, is a left-oblique pictorial-view of the specially modified Punching-platen, with action of the punching sequence suggested via the ref.-arrow; plus an area for detail study of the header-bar is referenced, as well as the special standoff-plate at the foot of the platen-deck, while a left-lateral arrow shows subsequent removal of the plate.

FIG. 6, is a partial left-side elevation cross-sectional view of the platen headerbar region as referenced in FIG. 5, wherein is indicated the punching action via phantom-outline.

FIG. 7, is a left-side cross-sectional elevation-view of the same platen apparatus shown in FIG. 6, but herein detailing the foot region of the invention.

FIG. 8, is a base-end elevation-view of the lower central longitudinal region of the platen, wherein is shown details of the preferred construction.

SPECIFICATIONS OF THE PREFERRED INVENTION EMBODIMENT

Study of drawing FIGS. 1 through 5 reveals the five basic sequential stages of the Pentarch/Registration-system as follows: reference to FIG. 1/A demonstrates how the conventional camera photo-table 10 is prepared with an ordinary drafting tool such as a T-square 11 so that the secondary reference(ref.)-lines 12 & 13 are substantially square with the table while exactly bisecting each other at 90-degrees. The operator then selects one of the several different Pentarch paste-up guide-sheets appropropriate to the job at hand, such as for a standard sized business-letterhead imprinting for example, whereby FIG. 1/B shows how the said guide-sheet 14 is simply placed over the said prescribed table ref.-lines 12/13 so as to align the ref./cutting-line 15 on the guide-sheet so that the lateral ends 15'/15" exactly overlap the said ref.-line 12, while the center ref.-line indica 16 of the guide-sheet is approximately overlaping the said ref.-line 13, thereby conveniently centering the guide-sheet layout to be so taped-down in place via art tape 17; whereupon sequence of FIG. 1/C shows how the actual artwork 18 (herein adorned with a simple X for clear understanding) is similarly positioned over the said guide-sheet 14 so as to be likewise centered relative to the ref. gridwork-indica thereon (not detailed for reason of seperate copyright coverage of different styles), and the artwork is thus pasted-down in place. Next, FIG. 2 demonstrates the 2nd-stage of the system operation whereby the photo-table 10 is shown tilted-up for exposure of the aggregate artwork matrix 14 & 18 through the symbolic camera-lens 19 to the standard photosensitive Printing-plate 20. Next, FIG. 3 demonstrates how the special backing-strip 21 is preferably applied to the backside of the said plate 20 in the region overlaping the earlier said ref./cutting-line 15 slightly at the top of the line (which is normally only imaged on the front-side of the plate 20, and is seen upturned so as to reveal the photo-imaged tick-mark 16"), while also shown is an exemplified roll 22 of backing-strip material which is preferably thin-guage aluminum-tape or a dimensionally stable plastic-tape such as the product known as Mylar—but regardless, the self-adhesive surface 23 is suitably protected via a customary tearaway cladstrip 24 until actual application. Since the more expensive metal printing-plates exhibit sufficient elongation-resistance, the special backing-strip 21 need only be applied to the inexpensive if popular, however relatively fragile paper-resin (or plastic) type printing-plates at any convenient stage prior to the critical trimming-stage of FIG. 4 which partly establishes the vital alignment edge 15 which has been carefully oriented with the artwork as earlier explained; and thus precision trimmed, the plate 20 is now transfered to the special Punch-platen apparatus 25 of FIG. 5, which is slightly modified from an otherwise conventional punch-platen, and includes a substantially standard headerbar portion 26 having a plurality of punch-pins 27 that exactly correspond to the exact center-to-center dimensions of the standardized mounting-pin plurality of a conventional printing-press, and are simultaneously cam-actuated via the manual handlever 28 whereby ref.-arrowing 28' demonstrates the action thereof. Also seen in FIG. 5 is a portion of the headerbar alignment-rail 29 to which the operator merely pushes the trimmed but as yet unperforated plate 20 against for critical initial alignment, whereupon the plate 20 is also positioned laterally so that the photo-imaged tick-marks 16'/16" are likewise checked for precise alignment beneath the special floating Sight-wire 30, at which point the operator executes the critical punching operation of the aggregate mounting-holes 27' into plate 20, thereby virtually locking-in the registration of the said tick-marks 16'/16" with the transverse mounting-holes 27', at which stage the perforated plate 20' is released for ready transfer directly to the printing-press as is suggested via the lateral-movement of arrow 31 of FIG. 5.

Note also in FIG. 5 that the Sight-wire 30 is positioned very close and parallel to the platen-deck 32, and is attached at the headerbar drop-center tab menber 33 having a tiny longitudinal mounting-hole 34 therein as may also be seen clearly in FIG. 6, including the preferred expedient of a simple tie-knot 35 employed to retain the preferably mono-filament wire 30 within the close fitting hole 34, although various other methods of retension would sulfice as well (such as a crimp-on sleeve entity for example). Still other features of the special platen apparatus shown include the platen-table portion 36 which is made flush with the extended platen-deck 37, the resting-legs 38 and resting surface 39. FIG. 6 also shows via phantom-outline sequence how the punch-pins 27 penetrate through both the plate 20 and its adhering backing-strip 21, causing the punch-scrap(s) 40 to fall away by gravity. Also indicated in the cross-section of FIG. 6 is an exemplified cam member 41 (attached to said handlever 28 or a motorized drive) which rotably engages via cam-follower entity 42 to depress the aggregate punch-pins 27.

Reference to FIG. 7 shows a detail cross-section view revealing how the wire 30 is routed at the foot of the platen-deck over stanchion member 43 so that the wire can be conveniently brought down and then beneath the deck into a specially formed recess-slot 44 wherein the wire 30 is coupled to a tension-spring 45 which is suitably anchored to a mooring-pin 46 fixed into the deck material; thereby achieving an attractively concealed and damage-protected head & foot mounting of the vital sight-wire 30.

Study of FIG. 8 shows another view of the wire-stanchion 43, whereby the features of FIG. 5 can be much more clearly understood, including a V-slot 47 for self-centering of the wire, and a preferred vertical recess-slot 48 which protects the wire as it passes down to the preferably inverted-Vee formation made into the stanchion plate so as to direct the wire toward the said spring arrangement and recess-slot 44 thereto; while dual screws 49/49' serve to fix the stanchion-plate in place. Thus comprising the preferred form of my invention.

Lastly, it will be apparent to those skilled in the art herein treated, that still further variations, alterations, and modifications may be resorted to according to the format setforth in this preferred embodiment, without substantially departing from the intended spirit & scope of the invention; which is still further recited in the appended claims and their legal or technical equivalents.

What I claim is:

1. A five-stage system of pre-press printing-plate preparation and special accoutrements thereto, serving to provide precise registration accuracy, rapid set-up time, and minimal press-spoilage; comprising the steps of:
    (I) initial mounting of a guide-sheet upon a substantially standard printers camera-table, said sheet having pre-scribed primary/reference-grid indica for easy superimposition alignment over secondary/ref.line indica prescribed upon said table surface, including tertiary overlay of the actual artwork upon the secondary guide-sheet as indicated;
    (II) photographically transfering the resulting step-I matrix format image directly upon a standard photosensitive printing-plate;
    (III) optionally applying an anti-elongation mounting-reinforcement directly upon the back of the upper/transverse-end region of the unpunched plate;
    (IV) precision trimming of the excess plate and said strip material extending above the special lateral primary/ref.cutting-line imaged from the said guide-sheet;
    (V) insertion of the precision trimmed printing-plate into a special punch-platen having a floating sighting-wire device for exact lateral axis positioning of the said plate, and a header-bar with an integral transverse alignment-rail set parallel to a plurality of punch-pins stationed within the said header-bar, thereby positioning the said plate against the said rail and along the exact central longitudinal-axis via two ref.tick-marks imaged upon the plate from the said guide-sheet indica, whereupon the operator sequences the simultaneous punching of the standard press/mounting-hole plurality thereby locking-in the essential registration alignment for subsequent transfer to press.

2. A pre-press registration system according to claim 1, whereby said stage-V floating sight-wire means is tantamount to a 3-dimensional ref.line elevated sufficiently above the said platens' deck as to allow the imaged-plate to be slid thereunder, yet said floating sight-wire is sufficiently close to the aggregate flat surfaces as to essentially eliminate visual-paralax misalignment relative to sighting of the 'wire' over the said tick-marks on the plate.

3. A floating sight-wire according to claim 2, which is preferable made of some mono-filament material such as dayglo-orange fishing-line, or stainless-steel.

4. A pre-press registration system according to claim 1, wherein said stage-V floating sight-wire is positioned parallel to the platen-deck from the said header-bar via a special drop-center tab like member having a tiny longitudinal wire-hole through which the said wire is pulled taut while being prevented from seperation therefrom by a blockage such as a tie-knot concealed from the emerging side of the said wire-tab which is preferably slightly recessed from sight beneath the said header-bar so as to negate any visual obscuring of the essential upper reference tick-mark.

5. A pre-press registration system according to claim 1, wherein said stage-V floating sight-wire is positioned parallel to the platen-deck at its foot extrimity via a central longitudinally grooved-stanchion member.

6. A sight-wire positioning arrangement according to claim 5, wherein said stanchion stand-off is preferably formed with a V-slot at its top portion so as to provide the wire with a self-centering action, and whereby the wire may be simply routed over said V-slot and downward, and then routed beneath the deck into a recess wherein the said wire is connected to a tension-spring protected within the said slot like recess wherein said spring is moored to exert a constant degree of tautness upon said wire.

7. A special printing-plate mounting-reinforcement option according to claim 1, whereby said means is a backing-strip of imperforate material such as thin aluminum or Mylar self-adhesive tape.

8. A system of pre-press offset/printing-plate preparation for consistantly accurate and efficient registration alignment upon a press; comprising:

squared layout of a predesigned guide-sheet having ref.-grid indica imprinted thereon in nonphoto-blue, upon a given conventional camera-table, relative to prescribed central vertical & horizontal secondary ref.-lines, whereupon is placed the camera-artwork for exposure by positioning the artwork within the said indica area so that a longitudinally central tick-mark is exposed at both top and bottom extremes of the said plate outside of the art image area; whereupon the plate is exposed in a normal manner, and if the plate is of the paper-resin type a special mounting-reinforcement backing-strip is applied to the plate, then the plate is trimmed along its top primary ref.cutting-line and transfered to a special punch-platen having a floating sight-wire under which the operator visually aligns the said tick-marks, at which time the operator sequences the simultaneous punching of all press mounting-holes, thereby finally locking-in the essential registration alignment for subsequent transfer to press.

9. A special pre-press registration system according to claim 8, wherein said backing-strip is preferably made of imperforate aluminum or Mylar self-adhesive tape.

10. A special pre-press registration system according to claim 8, wherein said floating sight-wire is attached to the platen header-bar at one end via a central means, while centrally attached at the foot of the platen over a stand-off index-slot, causing the said wire to be parallel to the platen-deck and given sufficient clearance for free passage of the plate thereunder.

11. A floating sight-wire according to claim 10, wherein said header-bar attachment means is preferably through a tiny hole within a special drop-center tab member set on line longitudinally with the center of the header-bar, while retension therein is made via an enlargement such as a tie-knot or equivalent blockage.

* * * * *